United States Patent [19]

Suga et al.

[11] Patent Number: 5,229,637
[45] Date of Patent: Jul. 20, 1993

[54] SEMICONDUCTOR DEVICE

[75] Inventors: Toru Suga; Kazuhiko Inoue, both of Yokohama, Japan

[73] Assignee: Kabushiki Kaisha Toshiba, Kawasaki, Japan

[21] Appl. No.: 913,452

[22] Filed: Jul. 15, 1992

Related U.S. Application Data

[63] Continuation-in-part of Ser. No. 704,838, May 20, 1991, Pat. No. 5,153,703, which is a continuation of Ser. No. 556,880, Jul. 23, 1990, abandoned, which is a continuation of Ser. No. 322,333, Mar. 10, 1989, abandoned.

[30] Foreign Application Priority Data

Mar. 14, 1988 [JP] Japan .................................. 63-59909

[51] Int. Cl.$^5$ ..................... H01L 29/167; H01L 21/20
[52] U.S. Cl. ..................................... 257/609; 257/611; 257/612; 257/472; 257/475; 437/81
[58] Field of Search ............... 257/609, 611, 612, 280, 257/472, 475; 437/81, 987

[56] References Cited

U.S. PATENT DOCUMENTS

| | | | |
|---|---|---|---|
| 4,602,965 | 7/1986 | McNally | 148/1.5 |
| 4,670,176 | 6/1987 | Morioka et al. | 252/62.3 |
| 4,905,061 | 2/1990 | Ohmuro et al. | 357/22 |
| 5,153,703 | 10/1992 | Suga et al. | 257/609 |

FOREIGN PATENT DOCUMENTS 60-54479 3/1985 Japan ..................................... 357/64

OTHER PUBLICATIONS

Miller et al., "Mechanisms for Low-Frequency Oscillations in GaAs," *IEEE Transactions on Electron Devices*, vol. ED-34, No. 6, Jun. 1987, pp. 1239-1244.

*Primary Examiner*—Mark V. Prenty
*Attorney, Agent, or Firm*—Finnegan, Henderson, Farabow, Garrett & Dunner

[57] ABSTRACT

In a semiconductor device constituting a GaAs MESFET, a GaAs substrate is prepared from a base material containing boron ions as a dopant impurity having a total impurity concentration of $2 \times 10^{17}$ atoms/cm$^3$ or more. The boron ions are introduced into the GaAs substrate during crystal growth so that a uniform distribution of boron ions in the substrate results. Electrode layers are formed at predetermined portions on the GaAs substrate, and an active layer is formed to be adjacent to the electrode layers by ion implantation. Source and drain electrodes are formed on the electrode layers respectively, and a gate electrode is formed on the active layer.

1 Claim, 1 Drawing Sheet

SEMICONDUCTOR DEVICE

CROSS-REFERENCES TO THE RELATED APPLICATIONS

This is a continuation-in-part of U.S. patent application Ser. No. 704,838, filed on May 20, 1991, and now U.S. Pat. No. 5,153,703 which is a continuation of U.S. patent application Ser. No. 556,880, filed on Jul. 23, 1990, now abandoned, which is a continuation of U.S. patent application Ser. No. 322,333, filed on Mar. 10, 1989, now abandoned, the disclosures of all of which are herein incorporated by reference.

BACKGROUND OF THE INVENTION

1. Field of the Invention

The present invention relates to an improvement of a semiconductor device constituting a GaAs MESFET.

2. Description of the Related Art

Conventionally, Cr-doped semi-insulating GaAs or non-doped LEC (Liquid Encapsulated Czochralski) GaAs has been used as a base material of a GaAs Metal-Semiconductor Field-Effect-Transistor (to be referred to as a GaAs MESFET hereinafter). In order to form a GaAs MESFET from this base material, the following manufacturing steps are conventionally required.

When a non-doped LEC GaAs substrate is used as a base material, a proper pretreatment is performed for the substrate. Thereafter, an SiOx layer having a thickness of, e.g., 5,000 Å is deposited on the substrate by chemical vapor deposition. Openings are formed on desired portions of the substrate through the SiOx layer using a photolithography technique. Si ions are implanted through the openings at an accelerated energy of 180 keV and a dose of $5 \times 10^{13}$ ions/cm$^2$, to form electrode layers corresponding to to the openings in the substrate. After the resist pattern including the SiOx layer is removed, a proper pretreatment is performed again on the surface of the substrate, and another SiOx layer is deposited by chemical vapor deposition. An opening is formed on the desired portion of the substrate through the SiOx layer by using a photolithography technique. Si ions are implanted through the opening at an accelerated energy of 100 keV and a dose of $3 \times 10^{-12}$ ions/cm$^2$, to form an active layer just under the opening in the substrate. Then, the resist pattern including the SiOx layer is removed. Thereafter, a capless annealing process is performed in an arsenic atmosphere at 850° for 15 minutes and the implanted Si ions are electrically activated. Finally, gate, source, and drain electrodes are formed on the substrate by a lift-off method.

As described above, it is known that a GaAs base material used in a GaAs MESFET obtained by conventionally-known manufacturing steps normally contains boron and carbon atoms, and the activation ratio of the implanted Si ions during a capless annealing process after an active layer is formed depends upon the concentrations of boron and carbon ions. For this reason, it has been attempted to reduce the concentrations of residual impurities such as boron and carbon ions. However, it is known that when the total concentration of boron and carbon ions contained in the base material is about $2 \times 10^{17}$ atoms/cm$^3$ or less, the drain current-drain voltage ($I_D - V_D$) characteristic curve of the manufactured GaAs MESFET represents a nonlinear operation, as shown at a point A in FIG. 1, at a predetermined voltage value, e.g., 3 V or more and a drain current value of 100 μAM or more. It is considered that these nonlinear characteristics are caused because the interface between the active layer formed by implantation of Si ions and the base material in contact with the active layer is not clear but is blurred, and a depth profile is formed loosely extending downward from the portion near the lower end of the active layer. More specifically, in a conventional GaAs MESFET, if the drain voltage, $V_D$, is increased, a leakage current flowing through a portion other than the active layer and the electrode layer formed in the substrate, in particular, a current flowing through the above-mentioned blurred portion starts oscillating at or above a predetermined threshold value. It is considered that because this current serves as a gate, the above-mentioned nonlinear characteristics are generated. The nonlinear operation of the drain current adversely affects the noise characteristics of the GaAs MESFET. In addition, it is confirmed that the above problem is similarly posed on a GaAs MESFET manufactured by forming an epitaxial layer on a base material As a means for solving the above problem, it has been already disclosed that high-concentration Cr ions serving as an impurity doped in a substrate can prevent the above-mentioned nonlinear operation, in "IEEE Transaction on Electron Devices., Vol. ED-34, No. 6, June 1987, pp. 1239–1244". However, in this disclosed technique, the problem of a large change in drain current, ID, over time is also pointed out.

SUMMARY OF THE INVENTION

The present invention has been made in consideration of the above situation, and has as its principal object to provide an improved semiconductor device constituting a GaAs MESFET having one or more advantages, such as, e.g., nonlinear operation can be suppressed and/or a change in drain current does not occur over a period of time.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

In order to achieve the above object, a semiconductor device comprising: a GaAs substrate prepared from a base material containing boron ions added to a crystal during growth of the crystal as a dopant impurity, and having an impurity concentration of more than $2 \times 10^{17}$ atoms/cm$^3$ and of less than $1 \times 10^{18}$ atoms/cm$^3$, thereby attaining a uniform distribution of boron ions in the substrate; electrode layers on predetermined portions of the GaAs substrate; an active layer formed adjacent to the electrode layers on the GaAs substrate by ion impregnating; and source and drain electrodes respectively on the electrode layers, and a gate electrode on the active layer. With the above arrangement, i.e., with a semiconductor device constituting a GaAs MESFET using, as a base material, a GaAs substrate containing boron ions at a total concentration of $2 \times 10^{17}$ atoms/cm$^3$ or more, there is provided a semiconductor device in which nonlinear operation can be suppressed and/or a change in drain current does not occur over a period of time.

BRIEF DESCRIPTION OF THE DRAWINGS

The accompanying drawings, which are incorporated in and constitute a part of this specification illustrate embodiments of the invention and, together with the description, serve to explain the principles of the invention. In the drawings.

DETAILED DESCRIPTION OF THE PREFERRED EMBODIMENTS

An embodiment of a semiconductor device according to the present invention will be described below with reference to FIGS. 2A to 2C and FIG. 3.

Figure 2A:
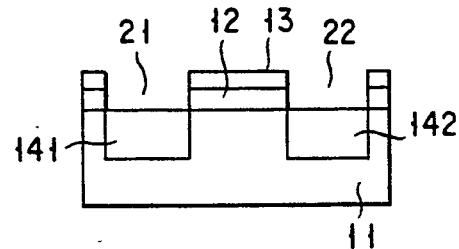
FIGS. 2A, 2B, and 2C are sectional views showing an embodiment of steps in manufacturing a semiconductor device according to the present invention.

As shown in FIG. 2A, a base material containing boron and carbon ions at a total impurity concentration of $2 \times 10^{17}$ atoms/cm$^3$ is used for a GaAs substrate 11. In the preferred embodiment of the present invention, boron is used as the exclusive dopant impurity ion. The boron ions are introduced into the base material of the substrate when the base material is prepared by crystal growth. Therefore, when the base material is grown by a Czochvalski technique, for example, the boron ions are uniformly distributed in the GaAs substrate. Preferably, the concentration of boron ions is more than $2 \times 10^{17}$ atoms per cm$^3$ and less than $1 \times 10^{18}$ atoms per cm$^3$.

After a proper pretreatment is performed on the GaAs substrate 11, an SiOx layer 12 having a thickness of, e.g., 5,000 Å is deposited on the substrate by chemical vapor deposition. Openings 21 and 22 are formed on desired portions of the substrate, through the SiOx layer, using resist pattern 13, by photolithography. Si ions are implanted in the openings 21 and 22 at an accelerated energy of 180 keV and a dose of $5 \times 10^{13}$ ions/cm$^2$ to form electrode layers 141 and 142.

Figure 2B:
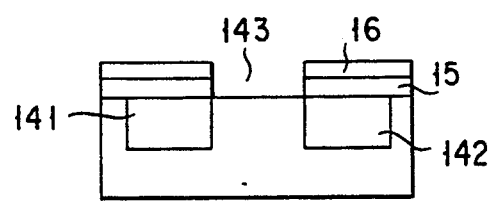
Figure 2C:
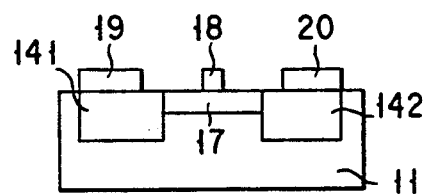

Then, as shown in FIG. 2B, the SiOx layer 12 and the resist pattern 13 are removed. Thereafter, a pretreatment is performed again on the surface of the GaAs substrate 11, and an SiOx layer 15 having a thickness of, e.g., 5,000 Å is deposited on the substrate by chemical vapor deposition. In addition, an opening 143 is formed on the GaAs substrate 11, through the SiOx layer 15, using resist pattern 16, by photolithography. Si ions are implanted through the opening 143 at an accelerated energy of 100 keV and a dose of $3 \times 10-12$ ions/cm$^2$ to form an active layer 17 in the GaAs substrate between the electrode layers 141 and 142, and the active layer 17 are formed, a capless annealing process is performed in an arsenic atmosphere at 850° for 15 minutes to electrically activate these ion-implanted layers.

Thereafter, a source electrode 19 is formed on the electrode layer 141, a drain electrode 20 is formed on the electrode layer 142, and a gate electrode 18 is formed on the active layer 17, by a lift-off method.

Figure 1:
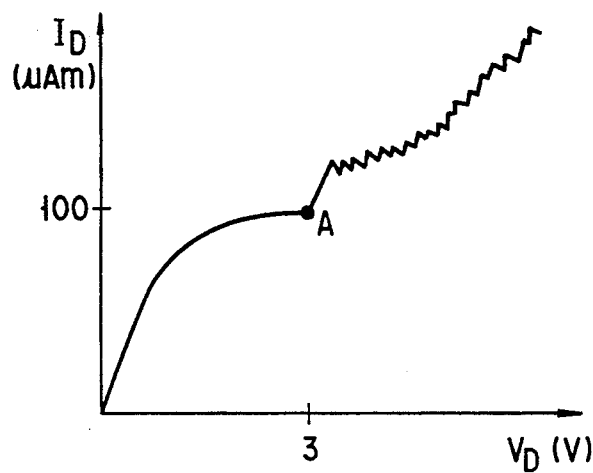
FIG. 1 is a graph showing drain current-drain voltage characteristics of a GaAs MESFET manufactured when the total concentration of impurities included in a base material is a conventional value.
Figure 3:
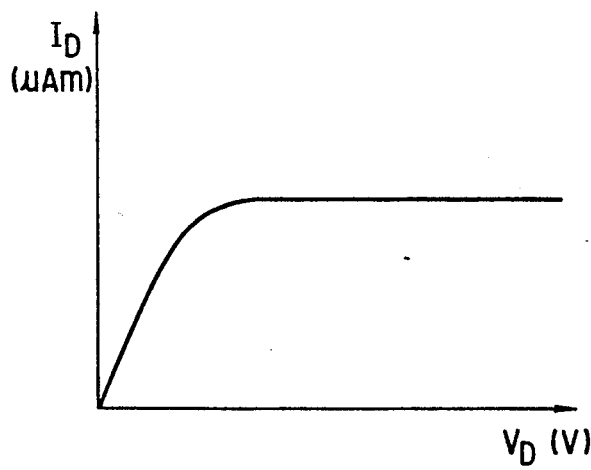
FIG. 3 is a graph showing drain current-drain voltage characteristics of the semiconductor device of the present invention.

In the semiconductor device constituting a GaAs MESFET of the present invention manufactured as described above, a base material containing boron and carbon ions for serving as an acceptor at a total impurity concentration of $2 \times 10^{17}$ atoms/cm$^3$ or more is used for the GaAs substrate 11. Thus, the boron and carbon ions cancel the Si ions serving as a donor forming the active layer 17. As a result, the blur of the lower end of the active layer 17 is eliminated, and the interface between the active layer 17 and the GaAs substrate 11 is rendered clear, thus suppressing a nonlinear operation, as shown in FIG. 3.

In the above embodiment, an example wherein a base material contains boron and carbon ions as impurities is exemplified, and the impurity concentration is represented as a total concentration of those ions. However, when the impurity concentration of only boron or carbon ions is $2 \times 10^{17}$ atoms/cm$^3$ or more, the same effect can be obtained as in the above embodiment. As a result, a nonlinear operation of the GaAs MESFET can be suppressed and a change in drain current does not occur over time.

The foregoing description of preferred embodiment of the invention has been presented for purposes of illustration and description. It is not intended to be exhaustive or to limit the invention to the precise form disclosed, and obviously many modifications and variations are possible in light of the above teachings or may be acquired from practice of the invention. The embodiment was chosen and described in order to best explain the principles of the invention and its practical application to thereby enable one skilled in the art to best utilize the invention in various embodiments and with various modifications as are suited to the particular use contemplated. It is intended that the scope of the invention be defined by the claims appended hereto.

What is claimed is:
1. A semiconductor device comprising:
   a GaAs substrate prepared from a base material containing boron ions added to a crystal during growth of the crystal as a dopant impurity, and having an impurity concentration of more than $2 \times 10^{17}$ atoms/cm$^3$ and of less than $1 \times 10^{18}$ atoms/cm$^3$, thereby attaining a uniform distribution of boron ions in said substrate;
   electrode layers on predetermined portions of said GaAs substrate;
   an active layer formed adjacent to said electrode layers on said GaAs substrate by ion impregnating; and
   source and drain electrodes respectively on said electrode layers, and a gate electrode on said active layer.

* * * * *